United States Patent
Wu

(10) Patent No.: US 12,165,910 B2
(45) Date of Patent: Dec. 10, 2024

(54) MANUFACTURING METHOD FOR SEMICONDUCTOR STRUCTURE

(71) Applicant: CHANGXIN MEMORY TECHNOLOGIES, INC., Hefei (CN)

(72) Inventor: Chao Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 557 days.

(21) Appl. No.: 17/447,191

(22) Filed: Sep. 8, 2021

(65) Prior Publication Data

US 2023/0011347 A1    Jan. 12, 2023

Related U.S. Application Data

(63) Continuation of application No. PCT/CN2021/107202, filed on Jul. 19, 2021.

(30) Foreign Application Priority Data

Jul. 12, 2021 (CN) .......................... 202110784653.3

(51) Int. Cl.
*H01L 21/762* (2006.01)
*H01L 21/311* (2006.01)
*H01L 21/32* (2006.01)

(52) U.S. Cl.
CPC ........ *H01L 21/76224* (2013.01); *H01L 21/32* (2013.01); *H01L 21/31111* (2013.01)

(58) Field of Classification Search
CPC ............................................... H01L 21/76224
See application file for complete search history.

(56) References Cited

U.S. PATENT DOCUMENTS

| 5,933,748 A | * | 8/1999 | Chou ................ H01L 21/76237 438/692 |
| 5,940,716 A | * | 8/1999 | Jin ..................... H01L 21/76224 257/E21.546 |
| 6,368,940 B1 | | 4/2002 | Amon |
| 6,518,148 B1 | * | 2/2003 | Cheng ............... H01L 21/76232 257/E21.549 |
| 6,774,007 B2 | | 8/2004 | Liu |
| 2003/0201473 A1 | | 10/2003 | Liu |
| 2008/0268589 A1 | * | 10/2008 | Farber .............. H01L 21/76232 257/E21.549 |
| 2010/0164054 A1 | * | 7/2010 | Lee ................... H01L 21/76232 257/E21.546 |
| 2015/0041948 A1 | | 2/2015 | Beijing |

FOREIGN PATENT DOCUMENTS

| CN | 104347473 A | 2/2015 |
| CN | 105655285 A | 6/2016 |
| CN | 109524345 A | 3/2019 |
| CN | 110911342 A | 3/2020 |
| CN | 112234024 A | 1/2021 |

\* cited by examiner

*Primary Examiner* — William A Harriston
(74) *Attorney, Agent, or Firm* — Syncoda LLC; Feng Ma

(57) ABSTRACT

A manufacturing method for a semiconductor structure includes: patterning and etching a semiconductor substrate to form a concave region; forming a first protective layer on a surface of the semiconductor substrate, the surface of the semiconductor substrate being a surface of a non-etched region except the concave region; forming an isolation structure in the concave region; and removing the first protective layer on the surface of the semiconductor substrate.

20 Claims, 3 Drawing Sheets

MANUFACTURING METHOD FOR SEMICONDUCTOR STRUCTURE

CROSS-REFERENCE TO RELATED APPLICATIONS

This application is a continuation of International Patent Application No. PCT/CN2021/107202 filed on Jul. 19, 2021, which claims priority to Chinese Patent Application No. 202110784653.3 filed on Jul. 12, 2021. The disclosures of these applications are hereby incorporated by reference in their entirety.

BACKGROUND

In a technology for manufacturing semiconductor devices, a shallow trench isolation (STI) technology is widely used. In an STI structure, silicon nitride is usually deposited on a semiconductor substrate, and then a hard mask having a pattern is formed. A trench is formed by etching the substrate outside a blocking region of a hard mask, and is filled with an oxide to form an isolation structure.

SUMMARY

The embodiments of the present disclosure relate to, but is not limited to, a manufacturing method for a semiconductor structure.

According to an aspect, there is provided a manufacturing method for a semiconductor structure, including: patterning and etching a semiconductor substrate to form a concave region; forming a first protective layer on a surface of the semiconductor substrate, the surface of the semiconductor substrate being a surface of a non-etched region except the concave region; forming an isolation structure in the concave region; and removing the first protective layer on the surface of the semiconductor substrate.

DETAILED DESCRIPTION

Figure 1:
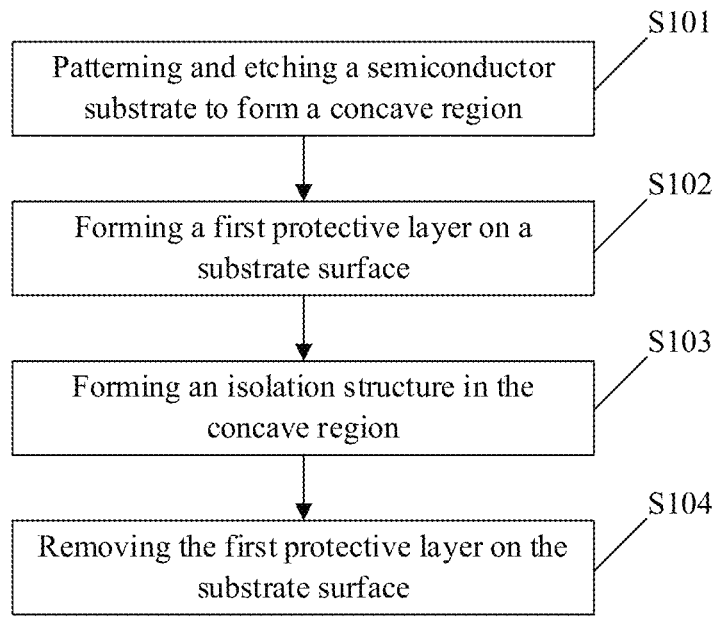
FIG. 1 is a flowchart of a manufacturing method for a semiconductor structure according to some embodiments of the present disclosure.

For better understanding of the disclosure, the disclosure will be described more comprehensively below with reference to related accompanying drawings. Preferred embodiments of the disclosure are illustrated in the drawings. However, the disclosure can be embodied in many different forms, and is not limited to the embodiments described herein. Rather, these embodiments are provided so that the disclosed content of the disclosure will be more thorough and complete.

Unless otherwise specified, all technical and scientific terms used herein are the same as meanings of general understandings of those skilled in the art of the disclosure. The terms used in the description of the disclosure herein are merely to describe the specific embodiments, and is not intended to limit the disclosure. The term "and/or" used herein includes any and all combinations of one or more related listed items.

In a process of forming STI in peripheral circuits, array regions, and the like, it is likely to cause a dent shape defect, called divot, which will cause a product failure or cause leakage and affect the product performance.

The technical solution of the present disclosure can be applied to memory products such as a Dynamic Random-Access Memory (DRAM), a Ferroelectric Random-Access Memory (FRAM), or a Magnetoresistive Random Access Memory (MRAM), or peripheral circuits of other semiconductor devices.

After active etching, sub-Si of a peripheral circuit will be oxidized through intermediate multi-step WET etching after active etching (ACTIVE EH) and a manufacturing process of a dual gate structure, so that marginal Si is partially oxidized to form Divot.

The embodiments of the present disclosure provide a manufacturing method for a semiconductor structure to reduce the above phenomenon. The technical solutions of the present disclosure will be further explained below with reference to the accompanying drawings and embodiments.

The embodiments of the present disclosure provide a manufacturing method for a semiconductor structure. As illustrated in FIG. 1, the method includes the following steps.

At step S101, a semiconductor substrate is patterned and etched to form a concave region.

At step S102, a first protective layer is formed on a surface of the semiconductor substrate. The surface of the semiconductor substrate is a surface of a non-etched region except the concave region.

At step S103, an isolation structure is formed in the concave region.

At step S104, the first protective layer on the surface of the semiconductor substrate is removed.

Figure 2:
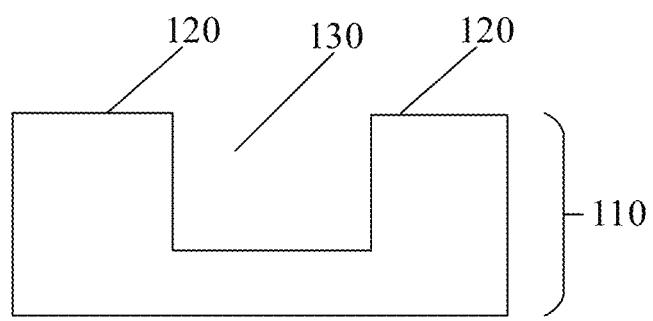
FIG. 2 is a schematic diagram of forming a concave region on a semiconductor substrate in a manufacturing method for a semiconductor structure according to some embodiments of the present disclosure.

In the embodiments of the present disclosure, as illustrated in FIG. 2, when a semiconductor device is manufactured using a wafer, the semiconductor substrate 110 on at least part of the surface may be patterned and etched. In the patterning and etching process, a mask, photoresist, or the like can be used to cover and protect a region (i.e., a region of the surface 120 of the semiconductor substrate) which does not need to be etched away, and a region (i.e., the above-mentioned concave region 130), which needs to be etched away to form a trench, is etched away.

Figure 3:
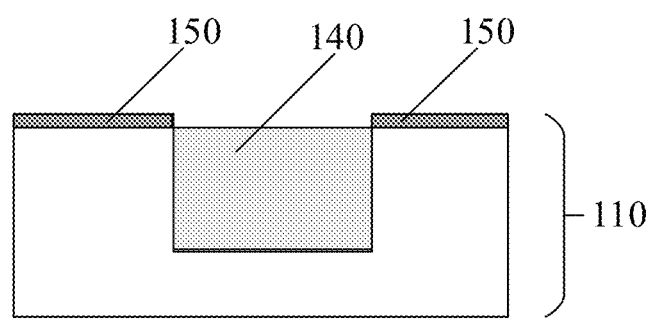
FIG. 3 is a schematic diagram of a first protective layer and an isolation structure in a manufacturing method for a semiconductor structure according to some embodiments of the present disclosure.

As illustrated in FIG. 3, the isolation structure 140 refers to a structure, such as a shallow trench isolation (STI) structure, in which an insulation layer with at least one layer of insulation material isolates two semiconductor substrate regions. This structure is widely used in a process for manufacturing sub-micron semiconductor integrated circuit products.

The concave region 130 is a region used to form the isolation structure 140. Therefore, in order to avoid damage to an edge of the surface 120 of the semiconductor substrate during the formation of the isolation structure, a Divot is formed. In the embodiments of the present disclosure, a first protective layer 150 is formed on the surface of the semiconductor substrate.

During the formation of the aforementioned isolation structure 140 in the concave region 130, various cleaning, etching, and other processes may be needed. Under the protection of the first protective layer 150, the phenomenon that the edge of the surface of the semiconductor substrate 120 is oxidized in these cleaning and etching processes can be relieved, thereby reducing the Divot, improving the product performance, and reducing the defect rate in a production process.

After the manufacturing process of the isolation structure is completed, the first protective layer can be removed by various methods such as cleaning, grinding, or etching, so as to complete the manufacturing process of the isolation structure.

In some embodiments, the forming a first protective layer on the surface of the semiconductor substrate includes the following steps.

A second protective layer is formed in the concave region.

The surface of the semiconductor substrate is oxidized under protection of isolation of the second protective layer to form the first protective layer.

The above-mentioned first protective layer needs to cover the surface of the semiconductor substrate except the concave region. Therefore, before the first protective layer is formed, a second protective layer may be formed in the concave region so that the first protective layer will not cover the concave region.

In the embodiments of the present disclosure, the method for forming the first protective layer may be that by oxidizing the surface of the semiconductor substrate, the film quality of silicon crystals on the surface of the semiconductor substrate is changed, thereby forming an oxide film serving as the first protective layer. The first protective layer is formed by oxidation, so that the process is simple and easy to implement.

Figure 4:
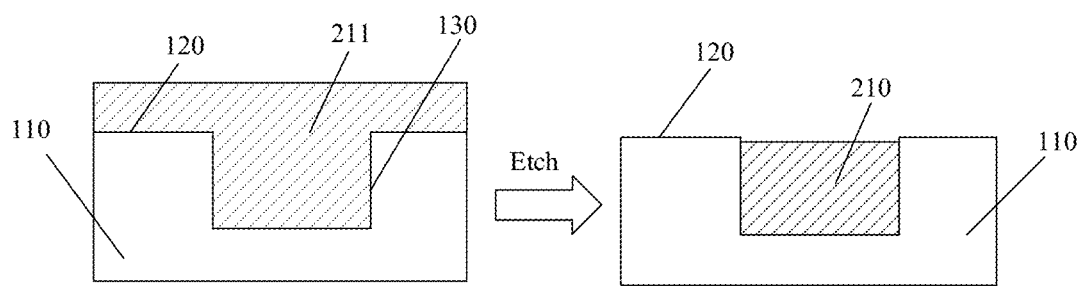
FIG. 4 is a schematic diagram of forming a second protective layer in the concave region in a manufacturing method for a semiconductor structure according to some embodiments of the present disclosure.

In some embodiments, as illustrated in FIG. 4, forming a second protective layer 210 in the concave region 130 includes the following steps.

A mask layer 211 is formed on the semiconductor substrate 110 subjected to patterning and etching.

The mask layer 211 is etched to expose the surface 120 of the semiconductor substrate. The remaining mask layer 211 is the second protective layer 210 in the concave region 130.

The mask layer formed on the semiconductor substrate can cover the entire semiconductor substrate, so that the concave region and the surface of the semiconductor substrate except the concave region are both covered. The mask layer may be a spin-on hard (SOH) mask layer, photoresist, or the like.

Then, the mask layer is thinned by an etching method, so that the surface of the semiconductor substrate except the concave region is exposed. The etching method can use liquid or gas that has a corrosive effect on the mask layer, so that the mask layer is corroded by a certain thickness.

The exposed substrate surface may be slightly higher than the remaining mask layer, i.e., the second protective layer, in the concave region, or may be on the same plane as the surface of the second protective layer. In this way, the first protective layer in the embodiment of the present disclosure can be formed on the exposed substrate surface. For forming the first protective layer, the exposed substrate surface can be oxidized, so that the silicon on the surface of the semiconductor substrate is oxidized to form a silicon oxide thin film. Alternatively, a layer of oxide film may be covered on the surface of the semiconductor substrate by means of depositing an oxide, thereby forming the first protective layer.

In this way, the region where the first protective layer needs to be formed can be exposed through the second protective layer, and the concave region can be blocked, thereby facilitating the subsequent formation of the first protective layer on the surface of the semiconductor substrate, without affecting the film quality of the concave region.

In some embodiments, after the mask layer is etched to expose the surface of the semiconductor substrate, the exposed substrate surface is higher than the surface of the remaining mask layer.

Figure 5:
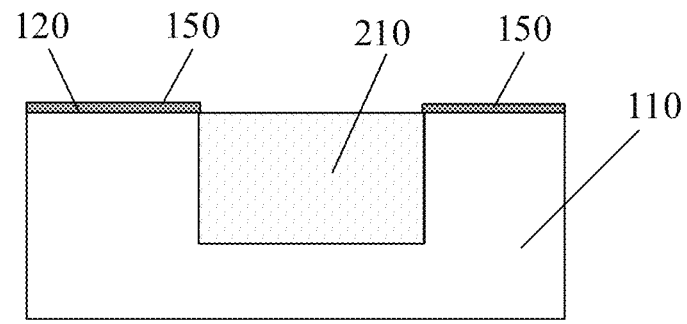
FIG. 5 is a schematic diagram of forming a first protective layer when the concave region has a second protective layer therein in a manufacturing method for a semiconductor structure according to some embodiments of the present disclosure.

As illustrated in FIG. 5, the surface of the second protective layer 210 remaining after the mask layer 211 is etched away is lower than the exposed substrate surface 120. In this way, the higher part of the surface of the semiconductor substrate can be oxidized to form the first protective layer 150 described above.

It is to be noted that a thickness of the first protective layer formed by the oxidation process may be equal to a thickness of the above-mentioned substrate surface on the second protective layer, or slightly greater or less than the thickness of the above-mentioned substrate surface on the second protective layer. The thickness is not limited here, as long as the first protective layer can uniformly cover the surface of the semiconductor substrate.

In some embodiments, the height of the exposed surface of the semiconductor substrate is higher 0.1 nm to 5 nm (e.g., 1 nm, 3 nm 3.5 nm, or 5 nm, etc) than the surface of the remaining mask layer. In practical application, parameters can be set according to product requirements or equipment capabilities.

In some embodiments, the performing oxidizing the surface of the semiconductor substrate to form the first protective layer includes the following steps.

Rapid thermal oxidation (RTO) process is performed on the surface of the semiconductor substrate to form a first oxygen-enriched layer; or a second oxygen-enriched layer is deposited on the surface of the semiconductor substrate by chemical vapor deposition (CVD). The first oxygen-enriched layer or the second oxygen-enriched layer is served as the first protective layer.

The above-mentioned method for forming the first protective layer includes oxidizing the surface of the semiconductor substrate to form an oxide thin film serving as the first protective layer. The oxidation process can be RTO, i.e., rapid thermal oxidation. Exemplarily, the surface of the semiconductor substrate can be rapidly oxidized by heating in an oxygen-enriched environment to form a dense silicon dioxide thin film, i.e., the above-mentioned first oxygen-enriched layer.

In addition, a CVD technology can also be used to deposit oxygen ions and O2 plasma on the surface of the semiconductor substrate, so that it reacts quickly with silicon on the surface of the semiconductor substrate to form a silicon dioxide thin film, i.e., the above-mentioned second oxygen-enriched layer.

Figure 6:
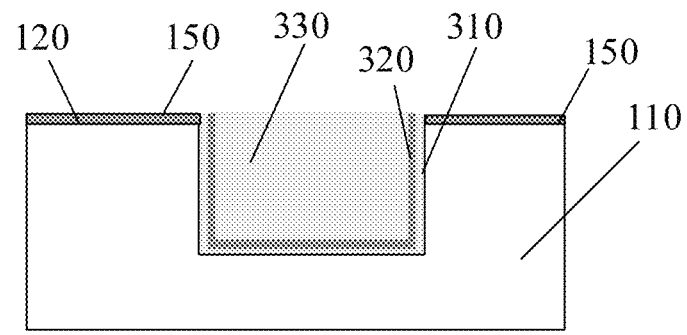
FIG. 6 is a schematic diagram of forming an isolation structure when a surface of a substrate has a first protective layer in a manufacturing method for a semiconductor structure according to some embodiments of the present disclosure.

In some embodiments, as illustrated in FIG. 6, the forming an isolation structure 140 in the concave region 130 includes the following steps.

A first oxide layer 310, a silicon nitride layer 320, and a second oxide layer 330 are sequentially deposited on the semiconductor substrate 110 subjected to patterning and etching. The second oxide layer 330 covers the surface 120 of the semiconductor substrate and the concave region 130.

The first oxide layer 310, the second oxide layer 330 and the silicon nitride layer 320 on the surface 120 of the semiconductor substrate are removed by a first cleaning process, so that the first protective layer 150 on the surface 120 of the semiconductor substrate is exposed. The first oxide layer 310, the silicon nitride layer 320, and the second oxide layer 330 in the concave region 130 are combined to constitute the isolation structure.

After the first protective layer is formed, the second protective layer in the concave region can be removed, and then the above-mentioned isolation structure can be formed in the concave region.

In the embodiments of the present disclosure, the aforementioned isolation structure may be a shallow trench isolation structure composed of three layers of insulation materials: the first oxide layer, the silicon nitride layer, and the second oxide layer. The first oxide layer and the second silicon dioxide may be silicon oxide or other oxides.

The first oxide layer and the silicon nitride layer may be a thin film uniformly covering an inner surface of the concave region, and may also cover the first protective layer in a film formation process. The second oxide layer can fill the entire concave region and cover the first protective layer, thereby forming a three-layer isolation structure in the concave region and on a side wall of a recess.

Then, the first oxide layer, the silicon nitride layer, and the second oxide layer which cover the first protective layer can be removed through the first cleaning process. The first protective layer on the surface of the semiconductor substrate is exposed, and the isolation structure in the concave region remains. In this way, the entire process of forming the isolation structure will not affect the surface of the semiconductor substrate covered by the first protective layer, thereby reducing the Divot generated at an edge position of a boundary between the surface of the semiconductor substrate and the concave region.

It is to be noted that the first cleaning process may be a physical cleaning method of grinding, or a chemical cleaning method of cleaning using a corrosive solution or gas. For example, the first oxide layer, the silicon nitride layer, and the second oxide layer are etched away by using an acid solution, thereby exposing the first protective layer.

In some embodiments, the removing the first protective layer on the surface of the semiconductor substrate includes the following steps.

The first protective layer on the surface of the semiconductor substrate is removed through a second cleaning process.

After the isolation structure is formed in the concave region, the first protective layer can be removed, and the surface of the semiconductor substrate is exposed again, so that the surface of the semiconductor substrate can be used to form other structures, such as a transistor structure.

The second cleaning process may be a peri clean process for a peripheral circuit region to clean the entire peripheral region of the semiconductor substrate to remove the first protective layer on the surface of the semiconductor substrate except the concave region.

In some embodiments, the second cleaning process includes the following steps.

The surface of the semiconductor substrate is cleaned by using a weak acid solution.

In order to reduce the damage to the surface of the semiconductor substrate by the second cleaning process, the weak acid solution can be used to remove the first protective layer only.

In some embodiments, the weak acid solution includes:
a hydrofluoric acid solution with a concentration less than or equal to 1/500.

In this way, damage to the isolation structure can be reduced, and the electrical performance of the peripheral circuit can be ensured.

It is to be understood that "one embodiment" or "an embodiment" mentioned in the whole article of the specification mean that specific features, structures or characteristics related to the embodiments are included in at least one embodiment of the present disclosure. Therefore, "in one embodiment" or "in an embodiment appearing in throughout the whole specification does not necessarily mean the same embodiment. In addition, these specific features, structures or characteristics may be combined in one or more embodiments in any proper manner. It is to be understood that in various embodiments of the present disclosure, the serial numbers of the above various processes do not mean the order of execution. The order of execution of the various processes shall be determined by their functions and an internal logic, and shall not constitute any limitations to the implementation processes of the embodiments of the present disclosure. The serial numbers of the embodiments of the present disclosure are only for description, and do not represent the quality advantages and disadvantages of the embodiments.

It is to be noted that terms "include", "including" or any other variants thereof herein are meant to cover non-exclusive inclusions, so that a process, method, object or device that includes a series of elements not only includes those elements, but also includes other elements which are not definitely listed, or further includes inherent elements of this process, method, object or device. Without more restrictions, elements defined by a sentence "includes a/an . . . " do not exclude that the process, method, object or device that includes the elements still includes other identical elements.

In the several embodiments provided by the present disclosure, it is to be understood that the disclosed device and methods may be implemented in other manners. The device embodiments described above are merely illustrative. For example, the division of the units is only logical function division. In actual implementation, there may be another division manner. For example, a plurality of units or components may be combined, or integrated into another system, or some features may be ignored or not executed. In addition, the mutual coupling or direct coupling or communication connection between the various components illustrated or discussed may be indirect coupling or communication connection through some interfaces, devices or units, or may be in electrical, mechanical or other forms.

The above units described as separate components may or may not be physically separated, and the components displayed as units may or may not be physical units. That is, they may be located in one place or distributed to multiple network units. Part or all of the units may be selected according to actual needs to achieve the purpose of the solutions of the present embodiment.

In addition, each functional module in each embodiment of the present disclosure may be integrated into one processing unit, or each unit may be separately used as one unit, or two or more units may be integrated into one unit. The above integrated units may be implemented in the form of hardware, or in the form of hardware and software functional units.

The foregoing descriptions are merely implementations of the present disclosure, but the protection scope of the present disclosure is not limited thereto. Any person skilled in the art can easily think of changes or replacements within the technical scope disclosed in the present disclosure shall fall within the scope of protection of the present disclosure. Therefore, the protection scope of the present disclosure should be subject to the appended claims.

The embodiments of the present disclosure provide a manufacturing method for a semiconductor structure. The method is applied to industrial production of semiconductor products. By means of the technical solutions of the embodiments of the present disclosure, the first protective layer is formed on the surface of the semiconductor substrate, and the isolation structure is formed in the etched concave region; and the first protective layer is removed after the isolation structure is formed. In this way, in the process of forming the isolation structure, the risk of generating Divot at the edge position of the isolation structure is reduced, and the product performance is improved.

What is claimed is:

1. A manufacturing method for a semiconductor structure, comprising:
   patterning and etching a semiconductor substrate to form a concave region;
   forming a first protective layer on a surface of the semiconductor substrate, the surface of the semiconductor substrate being a surface of a non-etched region except the concave region;
   forming an isolation structure in the concave region; and
   removing the first protective layer on the surface of the semiconductor substrate;
   wherein said forming a first protective layer on the surface of the semiconductor substrate comprises:
   forming a second protective layer in the concave region; and
   oxidizing the surface of the semiconductor substrate under protection of isolation of the second protective layer to form the first protective layer.

2. The manufacturing method of claim 1, wherein said forming the second protective layer in the concave region comprises:
   forming a mask layer on the semiconductor substrate subjected to patterning and etching; and
   etching the mask layer to expose the surface of the semiconductor substrate, wherein remaining mask layer is served as the second protective layer in the concave region.

3. The manufacturing method of claim 2, wherein after said etching the mask layer to expose the surface of the semiconductor substrate, a height of the exposed substrate surface is higher than that of the remaining mask layer surface.

4. The manufacturing method of claim 3, wherein the height of the exposed substrate surface is 0.1 nm to 5 nm higher than that of the remaining mask layer surface.

5. The manufacturing method of claim 1, wherein said oxidizing the surface of the semiconductor substrate to form the first protective layer comprises:
   performing rapid thermal oxidation (RTO) process on the surface of the semiconductor substrate to form a first oxygen-enriched layer, wherein the first oxygen-enriched layer is served as the first protective layer; or
   depositing a second oxygen-enriched layer on the surface of the semiconductor substrate by chemical vapor deposition (CVD), wherein the second oxygen-enriched layer is served as the first protective layer.

6. The manufacturing method of claim 1, wherein said forming the isolation structure in the concave region comprises:
   sequentially depositing a first oxide layer, a silicon nitride layer, and a second oxide layer on the semiconductor substrate subjected to patterning and etching, wherein the second oxide layer covers the surface of the semiconductor substrate and the concave region;
   removing the first oxide layer, the second oxide layer and the silicon nitride layer on the surface of the semiconductor substrate by a first cleaning process, so that the first protective layer on the surface of the semiconductor substrate is exposed, wherein the first oxide layer, the silicon nitride layer, and the second oxide layer in the concave region are combined to constitute the isolation structure.

7. The manufacturing method of claim 2, wherein said forming the isolation structure in the concave region comprises:
   sequentially depositing a first oxide layer, a silicon nitride layer, and a second oxide layer on the semiconductor substrate subjected to patterning and etching, wherein the second oxide layer covers the surface of the semiconductor substrate and the concave region;
   removing the first oxide layer, the second oxide layer and the silicon nitride layer on the surface of the semiconductor substrate by a first cleaning process, so that the first protective layer on the surface of the semiconductor substrate is exposed, wherein the first oxide layer, the silicon nitride layer, and the second oxide layer in the concave region are combined to constitute the isolation structure.

8. The manufacturing method of claim 3, wherein said forming the isolation structure in the concave region comprises:
   sequentially depositing a first oxide layer, a silicon nitride layer, and a second oxide layer on the semiconductor substrate subjected to patterning and etching, wherein the second oxide layer covers the surface of the semiconductor substrate and the concave region;
   removing the first oxide layer, the second oxide layer and the silicon nitride layer on the surface of the semiconductor substrate by a first cleaning process, so that the first protective layer on the surface of the semiconductor substrate is exposed, wherein the first oxide layer, the silicon nitride layer, and the second oxide layer in the concave region are combined to constitute the isolation structure.

9. The manufacturing method of claim 4, wherein said forming the isolation structure in the concave region comprises:
   sequentially depositing a first oxide layer, a silicon nitride layer, and a second oxide layer on the semiconductor substrate subjected to patterning and etching, wherein the second oxide layer covers the surface of the semiconductor substrate and the concave region;
   removing the first oxide layer, the second oxide layer and the silicon nitride layer on the surface of the semiconductor substrate by a first cleaning process, so that the first protective layer on the surface of the semiconductor substrate is exposed, wherein the first oxide layer, the silicon nitride layer, and the second oxide layer in the concave region are combined to constitute the isolation structure.

10. The manufacturing method of claim 5, wherein said forming the isolation structure in the concave region comprises:
sequentially depositing a first oxide layer, a silicon nitride layer, and a second oxide layer on the semiconductor substrate subjected to patterning and etching, wherein the second oxide layer covers the surface of the semiconductor substrate and the concave region;
removing the first oxide layer, the second oxide layer and the silicon nitride layer on the surface of the semiconductor substrate by a first cleaning process, so that the first protective layer on the surface of the semiconductor substrate is exposed, wherein the first oxide layer, the silicon nitride layer, and the second oxide layer in the concave region are combined to constitute the isolation structure.

11. The manufacturing method of claim 1, wherein said removing the first protective layer on the surface of the semiconductor substrate comprises:
removing the first protective layer on the surface of the semiconductor substrate through a second cleaning process.

12. The manufacturing method of claim 11, wherein the second cleaning process comprises:
cleaning the surface of the semiconductor substrate by using a weak acid solution.

13. The manufacturing method of claim 12, wherein the weak acid solution comprises:
a hydrofluoric acid solution with a concentration less than or equal to 1/500.

14. The manufacturing method of claim 6, wherein the first cleaning process comprises:
a physical cleaning method of grinding; or
a chemical cleaning method of cleaning using a corrosive solution or gas.

15. The manufacturing method of claim 5, wherein the rapid thermal oxidation (RTO) process comprises:
rapidly oxidizing the surface of the semiconductor substrate by heating in an oxygen-enriched environment to form the first oxygen-enriched layer; and
the chemical vapor deposition (CVD) comprises:
depositing oxygen ions and O2 plasma on the surface of the semiconductor substrate, so that it reacts quickly with silicon on the surface of the semiconductor substrate to form the second oxygen-enriched layer.

16. A manufacturing method for a semiconductor structure, comprising:
patterning and etching a semiconductor substrate to form a concave region;
forming a first protective layer on a surface of the semiconductor substrate, the surface of the semiconductor substrate being a surface of a non-etched region except the concave region;
forming an isolation structure in the concave region; and
removing the first protective layer on the surface of the semiconductor substrate;
wherein said forming the isolation structure in the concave region comprises:
sequentially depositing a first oxide layer, a silicon nitride layer, and a second oxide layer on the semiconductor substrate subjected to patterning and etching, wherein the second oxide layer covers the surface of the semiconductor substrate and the concave region;
removing the first oxide layer, the second oxide layer and the silicon nitride layer on the surface of the semiconductor substrate by a first cleaning process, so that the first protective layer on the surface of the semiconductor substrate is exposed, wherein the first oxide layer, the silicon nitride layer, and the second oxide layer in the concave region are combined to constitute the isolation structure.

17. The manufacturing method of claim 16, wherein the first cleaning process comprises:
a physical cleaning method of grinding; or
a chemical cleaning method of cleaning using a corrosive solution or gas.

18. The manufacturing method of claim 16, wherein said removing the first protective layer on the surface of the semiconductor substrate comprises:
removing the first protective layer on the surface of the semiconductor substrate through a second cleaning process;
and the second cleaning process comprises:
cleaning the surface of the semiconductor substrate by using a weak acid solution.

19. The manufacturing method of claim 18, wherein the weak acid solution comprises:
a hydrofluoric acid solution with a concentration less than or equal to 1/500.

20. A manufacturing method for a semiconductor structure, comprising:
patterning and etching a semiconductor substrate to form a concave region;
forming a first protective layer on a surface of the semiconductor substrate, the surface of the semiconductor substrate being a surface of a non-etched region except the concave region;
forming an isolation structure in the concave region; and
removing the first protective layer on the surface of the semiconductor substrate through a second cleaning process;
wherein the second cleaning process comprises:
cleaning the surface of the semiconductor substrate by using a weak acid solution comprising a hydrofluoric acid solution with a concentration less than or equal to 1/500.

* * * * *